(12) United States Patent
Liao et al.

(10) Patent No.: US 9,022,791 B2
(45) Date of Patent: May 5, 2015

(54) ELECTRICAL CONNECTOR WITH A SLEEVE ASSEMBLED THEREON

(71) Applicant: Hon Hai Precision Industry Co., Ltd., New Taipei (TW)

(72) Inventors: Fang-Jwu Liao, New Taipei (TW); Shuo-Hsiu Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 14/027,253

(22) Filed: Sep. 16, 2013

(65) Prior Publication Data

US 2014/0080328 A1    Mar. 20, 2014

(30) Foreign Application Priority Data

Sep. 14, 2012  (TW) .............................. 101217730 U

(51) Int. Cl.
*H01R 12/00* (2006.01)
*H01R 12/70* (2011.01)
*H05K 7/10* (2006.01)

(52) U.S. Cl.
CPC .......... *H01R 12/7005* (2013.01); *H05K 7/1053* (2013.01)

(58) Field of Classification Search
USPC ................................ 439/70, 71, 73, 525, 526
IPC .............. H05K 7/1084,7/1038, 7/1069, 7/1061, H05K 7/1023; H01R 23/722, 23/6806
See application file for complete search history.

(56) References Cited

U.S. PATENT DOCUMENTS

| | | | |
|---|---|---|---|
| 6,908,316 B2 | 6/2005 | Ma et al. | |
| 7,410,363 B1 * | 8/2008 | Gattuso et al. | 439/71 |
| 7,445,463 B2 * | 11/2008 | Tang et al. | 439/71 |
| 8,689,436 B2 * | 4/2014 | Hofmann et al. | 29/759 |

* cited by examiner

*Primary Examiner* — Hien Vu
(74) *Attorney, Agent, or Firm* — Wei Te Chung; Ming Chieh Chang

(57) ABSTRACT

An electrical connector for electrically connecting an IC package to a printed circuit board includes an insulating housing, a number of contacts received in the insulating housing and at least one sleeve assembled on the insulating housing. The insulating housing includes a bottom wall and a number of side walls extending upwardly from the bottom wall. The bottom wall and the side walls define a cavity for accommodating the IC package. The sleeve is assembled on the side wall and defines a supporting portion towards the cavity. The supporting portion includes a pair of abutting walls perpendicular to each other.

9 Claims, 6 Drawing Sheets

ELECTRICAL CONNECTOR WITH A SLEEVE ASSEMBLED THEREON

BACKGROUND OF THE INVENTION

1. Field of the Invention

The present disclosure relates to an electrical connector for connecting an IC package with a printed circuit board (PCB), and more particularly to an electrical connector with at least one sleeve assembled thereon.

2. Description of Related Art

U.S. Pat. No. 6,908,316 issued to Ma, et al. on Jun. 21, 2005 discloses an electrical connector for connecting an IC package to a PCB. The electrical connector is soldered on the PCB and electrically contacts the IC package so as to establish an electrical connection therebetween. The electrical connector comprises an insulating housing. The insulating housing comprises a bottom wall and a plurality of side walls extending from the bottom wall to form a cavity for receiving the IC package. In order to position the IC package accurately, the insulating housing further comprises a plurality of protrusions extending from the side walls into the cavity. When the IC package is assembled in the cavity, the protrusions position the IC package therein to establish a stable electrical connection.

However, as the electrical connector is soldered on the PCB, during the soldering process, the side walls of the insulating housing deform easily which results in expansion of the cavity. Therefore, the protrusions on the side walls fail to position the IC package accurately. So the electrical connection is poor, even failure.

In view of the above, an improved electrical connector is desired to overcome the problems mentioned above.

SUMMARY OF THE INVENTION

Accordingly, an object of the present disclosure is to provide an electrical connector positioning an IC package accurately so as to establish an electrical connection stably.

According to one aspect of the present disclosure, an electrical connector for electrically connecting an IC package to a printed circuit board is provided. The electrical connector comprises an insulating housing, a plurality of contacts received in the insulating housing and at least one sleeve assembled on the insulating housing. The insulating housing comprises a bottom wall and a plurality of side walls extending upwardly from the bottom wall. The bottom wall and the side walls define a cavity for accommodating the IC package. The sleeve is assembled on the side wall and defines a supporting portion towards the cavity. The supporting portion comprises a pair of abutting walls perpendicular to each other.

Other objects, advantages and novel features of the disclosure will become more apparent from the following detailed description when taken in conjunction with the accompanying drawings, in which:

DETAILED DESCRIPTION OF THE INVENTION

Reference will now be made to the drawings to describe the present disclosure in detail.

Figure 1:
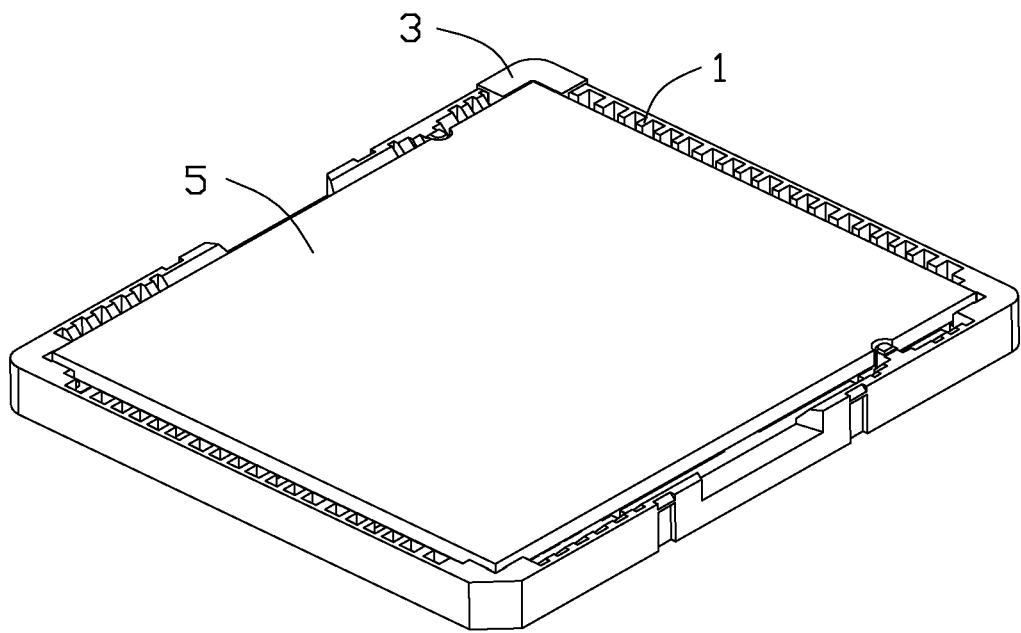
FIG. 1 is an assembled, perspective view of an electrical connector in accordance with a preferred embodiment of the present disclosure, wherein an IC package is assembled therein.
Figure 2:
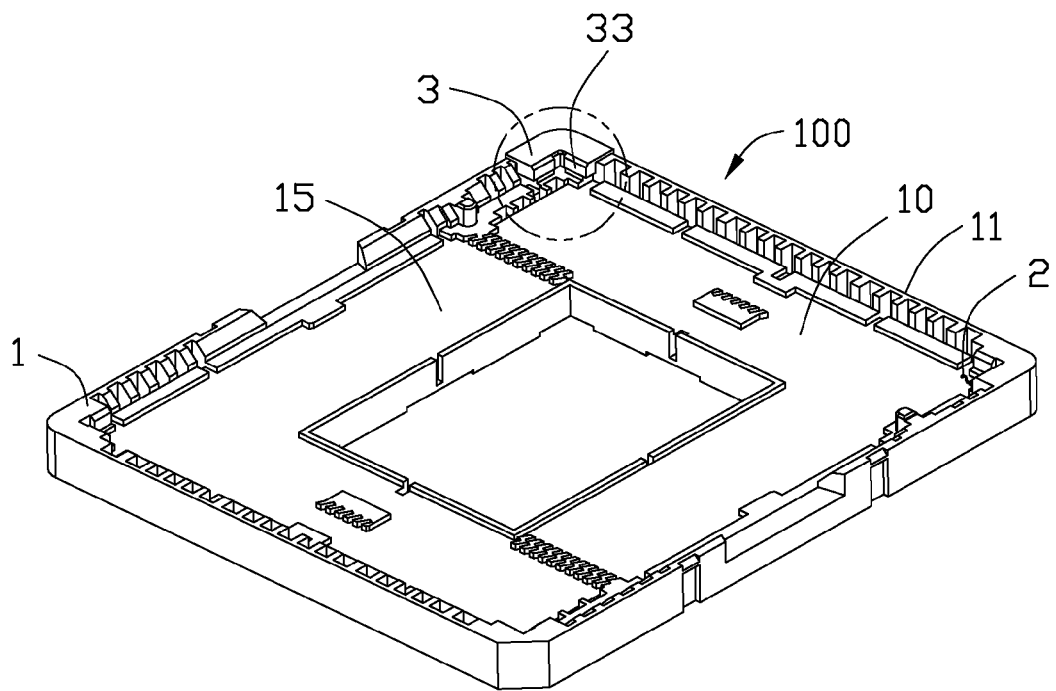
FIG. 2 is an assembled, perspective view of the electrical connector shown in FIG. 1.

Referring to FIG. 1 and FIG. 2, an electrical connector 100 for electrically connecting an IC package 5 to a printed circuit board (not shown) comprises an insulating housing 1, a plurality of contacts 2 retained in the insulating housing 1, and at least one accessory or sleeve 3 assembled on the insulating housing 1.

Figure 3:
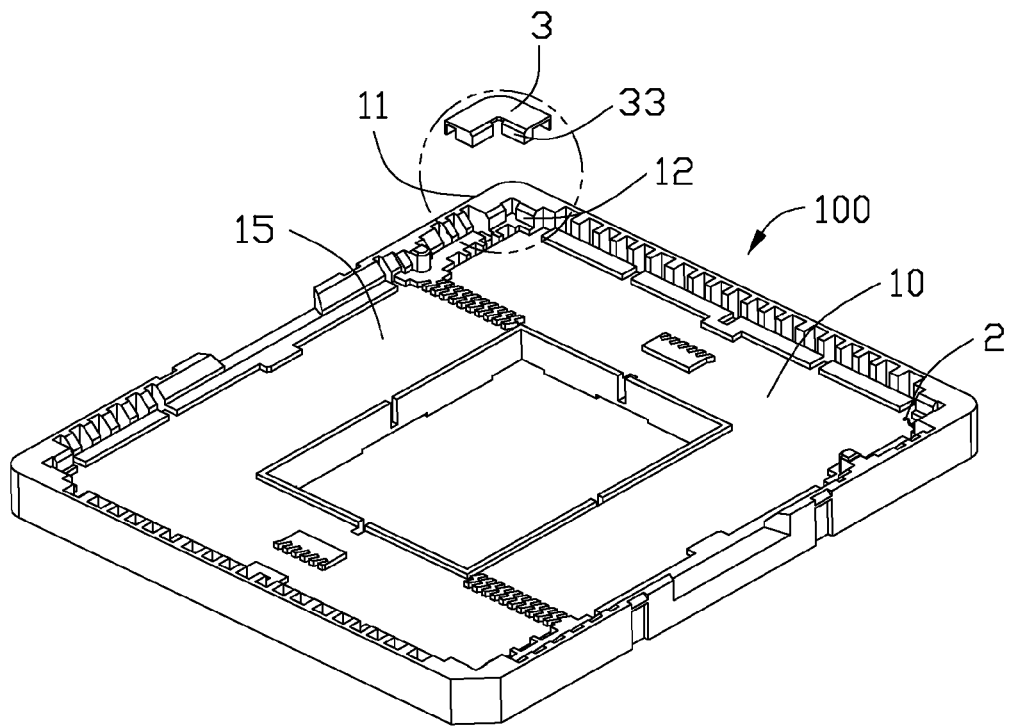
FIG. 3 is an exploded, perspective view of the electrical connector shown in FIG. 1.
Figure 5:
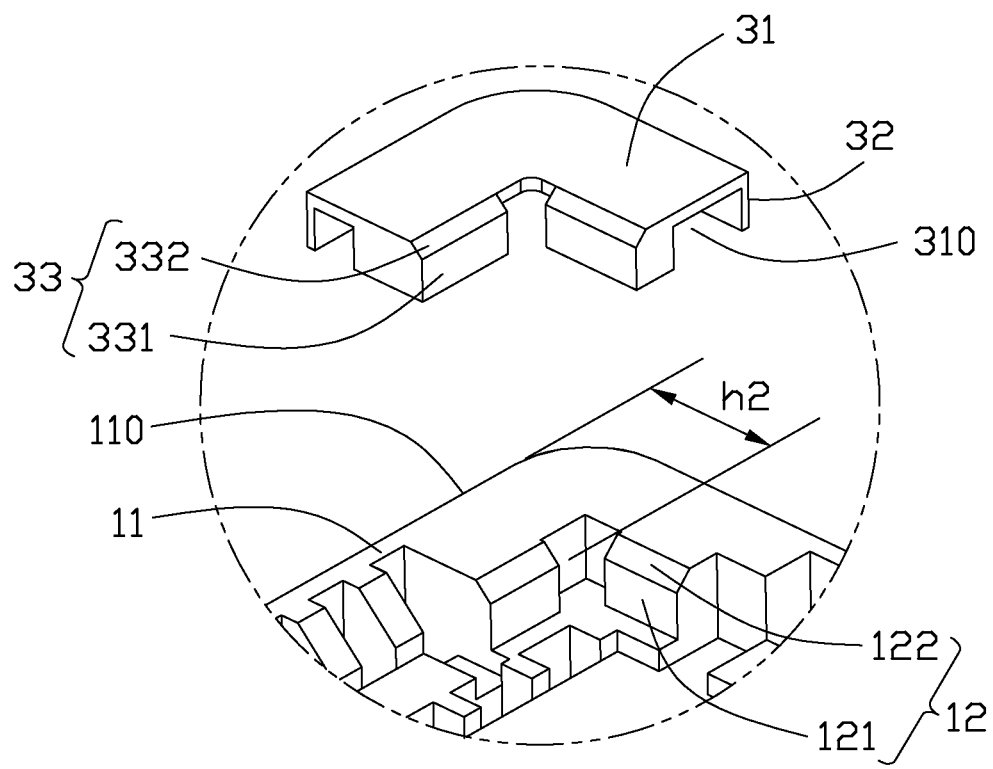
FIG. 5 is a partial enlarged view of the circled portion shown in FIG. 3.

Referring to FIG. 3 and FIG. 5, the insulating housing 1 configured with rectangle comprises a bottom wall 10 and four side walls 11 extending upwardly from the bottom wall 10. The bottom wall 10 together with four side walls 11 defines a cavity 15 for receiving the IC package 5. The side walls 11 connect with each other successively defining four corners. Each of the side walls defines a datum protrusion 12 at the corner and extending towards the cavity 15. The datum protrusion 12 comprises a vertical surface 121 for abutting against the IC package 5, and a tilt surface 122 for guiding the IC package 5 into the cavity 15. The side wall 11 comprises an outer surface 110 opposite to the vertical surface 121 of the datum protrusion 12.

Figure 4:
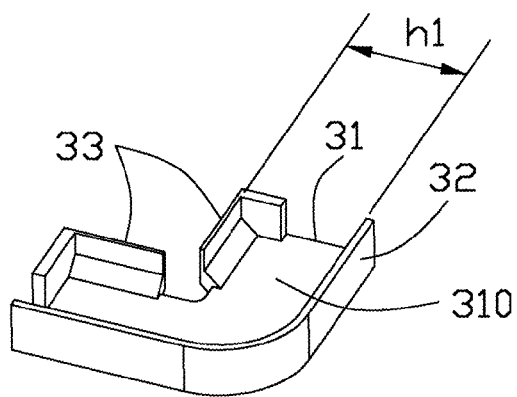
FIG. 4 is a perspective view of a sleeve shown in FIG. 3.
Figure 6:
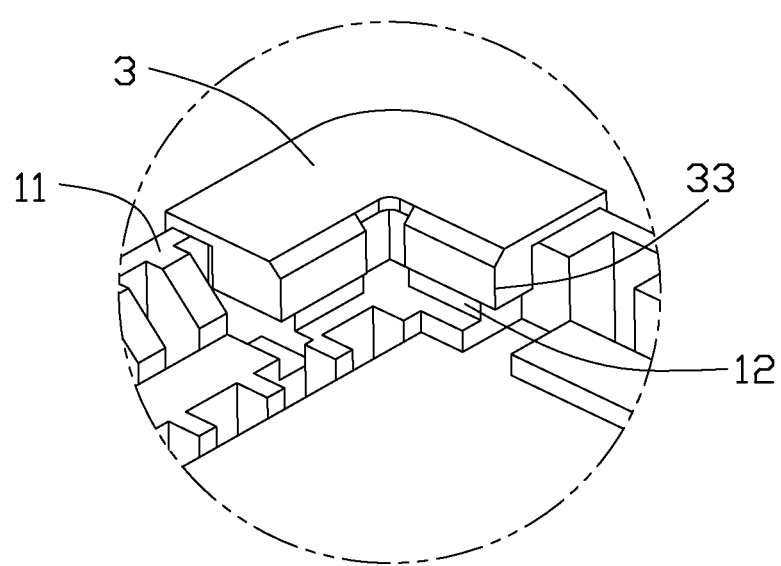
FIG. 6 is a partial enlarged view of the circled portion shown in FIG. 2.

Referring to FIG. 4 to FIG. 6, the sleeve 3 is assembled on one of the corners of the side wall 11. The sleeve 3 is L shaped and similar to the shape of the corner. The sleeve 3 comprises an L-shaped base portion 31. The L-shaped base portion 31 defines an outer edge and an inner edge opposite to each other. The base portion 31 comprises two parts, said two parts are in the same plane. The sleeve 3 comprises a back wall 32 extending downwardly from the outer edge of the base portion 31 and a supporting portion 33 extending downwardly from the inner edge of the base portion 31. The supporting portion 33 comprises a pair of abutting walls 331 and tilted guiding walls 332 connecting the base portion 31 and the abutting walls 331. Said two abutting walls 331 are perpendicular to each other. Said two abutting walls 331 extend from two parts of the base portion 31 respectively and a gap is defined between two abutting walls 331. A passageway 310 is formed between the supporting portion 33 and the back wall 32. The width of the passageway 310 is h1 shown in FIG. 4.

Referring to FIG. 5 and FIG. 6, in the preferred embodiment, when assembling, the sleeve 3 is pressed onto the corner of the side walls 11. As the width h1 of the passageway 310 is no more than the distance h2 from the outer surface 110 of the side wall to the vertical surface 121 of the datum protrusion 12, the sleeve 3 engages with the side walls 11 to retain thereon. The back wall 32 of the sleeve 3 abuts against the outer surface 110 of the side wall 11 while the supporting portion 33 abuts against the datum protrusion 12. The inner surface of the abutting wall 331 abuts against the vertical surface 121, the inner surface of the guiding wall 332 abuts against the tilt surface 122. In other embodiment, glue can be defined between the sleeve 3 and the side wall 11 for enhancing the retention therebetween.

According to the above described embodiment of the present disclosure, an electrical connector 100 with at least one sleeve 3 assembled thereon is provided. The sleeve 3 can compensate for the expansion of the cavity 15 caused by heating so as to position the IC package 5 accurately. According to actual needs, one or more sleeve 3 can be assembled on the corners of the insulating housing 1.

While preferred embodiments in accordance with the present disclosure has been shown and described, equivalent modifications and changes known to persons skilled in the art according to the spirit of the present disclosure are considered within the scope of the present disclosure as defined in the appended claims.

What is claimed is:

1. An electrical connector for electrically connecting an IC package to a printed circuit board comprising:
   an insulating housing comprising a bottom wall and a plurality of side walls extending from the bottom wall, the bottom wall and the side walls define a cavity for accommodating the IC package, the side walls comprising a plurality of datum protrusions extending towards the cavity;
   a plurality of contacts retained in the bottom wall and extending into the cavity for contacting the IC package; and
   a sleeve assembled on the side walls of the insulating housing, the sleeve comprising a supporting portion extending towards the cavity, the supporting portion abutting against the datum protrusions and comprising a pair of abutting walls perpendicular to each other;
   wherein the datum protrusion comprises a vertical surface extending into the cavity, the abutting wall abuts against the vertical surface;
   wherein the sleeve comprises an L-shaped base portion defining a base portion, an outer edge and an inner edge opposite to each other and connected with the base portion, and wherein a back wall is defined from the outer edge while the supporting portion is defined from the inner edge;
   wherein a passageway is formed between the supporting portion and the back wall, the width of the passageway is no more than the distance from an outer surface of the side wall to the vertical surface of the datum protrusion for engaging with the side wall; and
   wherein the sleeve is assembled on a corner formed by two side walls, the supporting portion abuts against two datum protrusions extending from the two side walls respectively.

2. The electrical connector as claimed in claim 1, wherein the supporting portion comprises a guiding wall above the abutting wall while the datum protrusion comprises a tilt surface above the vertical surface, and wherein the guiding wall abuts against the tilt surface.

3. The electrical connector as claimed in claim 1, wherein the electrical connector comprises glue defined between the sleeve and the side wall.

4. The electrical connector as claimed in claim 1, wherein a gap is defined between two abutting walls.

5. A sleeve for retaining on a side wall of an electrical connector to against an IC package comprising:
   an L-shaped base portion on a horizontal plane defining an outer edge and an inner edge opposite to each other; and
   a supporting portion extending downwardly from the inner edge of the base portion;
   wherein the supporting portion comprises two abutting walls perpendicular to each other for positioning the IC package;
   wherein the supporting portion comprises a guiding wall extending from the inner edge downwardly and obliquely;
   wherein the abutting wall extends from the guiding wall downwardly and vertically;
   wherein the sleeve comprises a back wall extending downwardly from the outer edge of the base portion, and wherein the back wall together with the supporting portion defines a passageway; and
   wherein a gap is defined between two abutting walls.

6. An electrical connector for use with an electronic package, comprising:
   an insulative housing defining an upward facing receiving cavity surrounding by side walls;
   a plurality of contacts disposed in the housing with contacting sections upwardly extending into the receiving cavity;
   a plurality of datum protrusions formed upon the side walls and extending inwardly beyond interior faces of the side walls to provide datum faces thereon for abutting against corresponding side faces of the electronic package under a normal condition; and
   at least one accessory optionally attached to the housing and providing an abutting wall for transversely abutting against the corresponding side face of the electronic package when the corresponding datum face adjacent to the abutting wall is unable to efficiently abut against the corresponding side face of the electronic package due to surface mounting defect of the housing;
   wherein the accessory is directly mounted upon the corresponding datum protrusion as a sleeve to cover the corresponding datum face by the abutting wall;
   wherein the abutting wall is vertical, and the accessory further defines a slanting guiding wall above the abutting wall for guiding downward insertion of the electronic package into the receiving cavity; and
   wherein said accessory defines a right angle structure in a top view to occupy a corner of the housing and provide two abutting walls perpendicular to each other.

7. The electrical connector as claimed in claim 6, wherein said accessory is secured to the corresponding datum protrusion either in an interference fit or by glue.

8. The electrical connector as claimed in claim 7, wherein the datum face of the datum protrusion is vertical, and the datum protrusion further defines a tilting surface above the datum face for guiding downward insertion to the electronic package into the receiving cavity.

9. The electrical connector as claimed in claim 6, wherein the right angle structure of said accessory is not symmetrical with regard to a diagonal direction thereof.

* * * * *